(12) United States Patent
Kim et al.

(10) Patent No.: US 6,489,214 B2
(45) Date of Patent: Dec. 3, 2002

(54) METHOD FOR FORMING A CAPACITOR OF A SEMICONDUCTOR DEVICE

(75) Inventors: Yeong-kwan Kim, Seongnam (KR); In-seon Park, Seoul (KR); Sang-min Lee, Seoul (KR); Chang-soo Park, Sueon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/962,327

(22) Filed: Sep. 26, 2001

(65) Prior Publication Data

US 2002/0058391 A1 May 16, 2002

Related U.S. Application Data

(63) Continuation of application No. 09/226,006, filed on Jan. 6, 1999, now Pat. No. 6,335,240.

(30) Foreign Application Priority Data

Jan. 6, 1998 (KR) ................................................ 98/135

(51) Int. Cl.[7] .............................................. H01L 21/20
(52) U.S. Cl. ...................... 438/396; 438/253; 438/254; 438/643
(58) Field of Search .................. 438/396, 253–257, 438/397–399, 775, 30, 643, 699, 597; 257/302–304, 192, 330–334

(56) References Cited

U.S. PATENT DOCUMENTS

| 3,894,872 | A |   | 7/1975  | Mitchell, Jr. et al. |        |
|-----------|---|---|---------|----------------------|--------|
| 3,982,906 | A | * | 9/1976  | Hirai et al.         | 419/19 |
| 4,252,579 | A |   | 2/1981  | Ho et al.            |        |
| 4,366,613 | A |   | 1/1983  | Ogura et al.         |        |
| 4,481,283 | A | * | 11/1984 | Kerr et al.          | 430/319 |
| 4,891,684 | A |   | 1/1990  | Nishioka et al.      |        |
| 4,936,957 | A |   | 6/1990  | Dickey et al.        |        |
| 4,983,422 | A |   | 1/1991  | Davis et al.         |        |
| 4,983,544 | A |   | 1/1991  | Lu et al.            |        |
| 5,104,636 | A |   | 4/1992  | Davis et al.         |        |
| 5,141,603 | A |   | 8/1992  | Dicket et al.        |        |
| 5,153,685 | A |   | 10/1992 | Murata et al.        |        |
| 5,196,722 | A |   | 3/1993  | Bergendahl et al.    |        |
| 5,362,666 | A |   | 11/1994 | Dennison             |        |
| 5,365,097 | A |   | 11/1994 | Kenney               |        |
| 5,374,570 | A | * | 12/1994 | Nasu et al.          | 438/30 |
| 5,488,579 | A |   | 1/1996  | Sharma et al.        |        |
| 5,698,869 | A | * | 12/1997 | Yoshimi et al.       | 257/192 |
| 6,048,764 | A |   | 4/2000  | Suzuki et al.        |        |

OTHER PUBLICATIONS

Y. Ohji et al.; "TA205 Capacitors' Dielectric Material For Giga–bit DRAMs" 1995.

Soon Oh Park et al.; Fabrication and Electrical Characterization of Pat (BA,SR) TIO3/PT Capacitors for Ultalarge–Scale Integrated Dynamic Random Access Memory Applications vol. 35, (1996) pp. 1548–1552.

* cited by examiner

*Primary Examiner*—Olik Chaudhuri
*Assistant Examiner*—Yennhu B. Huynh
(74) *Attorney, Agent, or Firm*—Volentine Francos, PLLC

(57) ABSTRACT

A capacitor having high capacitance using a silicon-containing conductive layer as a storage node, and a method for forming the same, are provided. The capacitor includes a storage node, an amorphous $Al_2O_3$ dielectric layer, and a plate node. The amorphous $Al_2O_3$ layer is formed by a method in which reactive vapor phase materials are supplied on the storage node, for example, an atomic layered deposition method. Also, the storage node is processed by rapid thermal nitridation before forming the amorphous $Al_2O_3$ layer. The amorphous $Al_2O_3$ layer is densified by annealing at approximately 850° C. after forming a plate node, to thereby realize the equivalent thickness of an oxide layer which approximates a theoretical value of 30 Å.

20 Claims, 5 Drawing Sheets

METHOD FOR FORMING A CAPACITOR OF A SEMICONDUCTOR DEVICE

CROSS REFERENCE TO RELATED APPLICATIONS

This is a continuation of application Ser. No. 09/226,006, filed Jan. 6, 1999, now U.S. Pat. No. 6,335,240 the entirety of which is incorporated herein by reference.

BACKGROUND OF THE INVENTION

1. Field of the Invention

The present invention relates to a capacitor of a semiconductor device, and a method for forming the same.

2. Description of the Related Art

As semiconductor devices become more highly integrated, there is a necessity for reducing the area occupied by a capacitor, which in turn causes a reduction in the capacitance. To solve this problem, the structure of the capacitor is changed or a material having a high dielectric constant is employed. For instance, a method has been proposed for forming a capacitor using a $Ta_2O_5$ dielectric layer or a $(Ba,Sr)TiO_3$ (BST) dielectric layer having a dielectric constant higher than that of an oxide/nitride/oxide (ONO) layer structure typically used for a dynamic random access memory (DRAM).

However, the process is complicated. The structure of a typical capacitor is a silicon/insulator/silicon (SIS) layer structure in which polycrystalline silicon layers doped with an impurity are used for plate and storage nodes. However, a metal/insulator/silicon (MIS) layer or a metal/insulator/metal (MIM) layer structure is required for the case of using the $Ta_2O_5$ layer, and the MIM layer structure is required for the case of using the BST layer. That is, the structure of the capacitor must be changed.

If the $Ta_2O_5$ layer is used, then in order to overcome low step coverage, a layer must be formed using chemical vapor deposition (CVD) at a low temperature, which is a surface kinetic regime, and which may cause a deficiency in oxygen, leaving hydrocarbon residue in the layer or deterioration in crystallization. Thus, the dielectric constant is reduced, and insulating properties are poor. Accordingly, to overcome these problems, a dry $O_2$ annealing process at a high temperature is additionally required. Also, there has been disclosed a method for compensating for the insulating properties of the $Ta_2O_5$ layer by using an oxide layer under the $Ta_2O_5$ layer generated by a dry annealing process (Y. Ohyi, "$Ta_2O_5$ Capacitor Dielectric Material for Giga-bit DRAMs", IEDM Tech. Dig., 1994. p831).

Meanwhile, diffusion is easily caused by discontinuities in the atomic arrangement at a grain boundary. Thus, when a thick oxide layer is formed to compensate for the leakage current properties of the $Ta_2O_5$ layer, diffusion of oxygen into the grain boundary is increased, to thereby oxidize a plate node. Accordingly, a reaction preventing layer is required between the $Ta_2O_5$ layer and the plate node of the capacitor to prevent reaction of the $Ta_2O_5$ layer with the plate node (U.S. Pat. No. 4,891,684).

In order to obtain excellent leakage current properties, a Schottky barrier must be formed between a BST layer and an electrode. In order to form the Schottky barrier, an electrode should be formed of materials having a high work function, e.g., a metal (see Soon Oh Park, "Fabrication and Electrical Characterization of Pt/(Ba, Sr)TiO$_3$/Pt Capacitors for Ultralarge-scale Integrated Dynamic Random Access Memory Applications", Jpn. J. Appl. Phys. Vol. 35, 1996, pp. 1548–1552). In order to employ the metal electrode, an ohmic contact must be formed at an interface between the metal electrode and the polycrystalline silicon layer doped with an impurity. That is, an intermediate layer forming the ohmic contact must be formed and a barrier layer must be employed.

The material layer of a high dielectric constant, such as the $Ta_2O_5$ layer or the BST layer, requires a complicated process and structure, that is, a change of the structure of the capacitor to the MIM or MIS structure.

SUMMARY OF THE INVENTION

It is an object of the present invention to provide a capacitor of a semiconductor device, using a silicon-containing conductive layer as a storage node to increase capacitance.

It is another object to provide a method for forming a capacitor of a semiconductor device, using a silicon-containing conductive layer as a storage node to increase capacitance. Other and further objects will appear hereafter.

Accordingly, to achieve one objective, the capacitor of the present invention includes a storage node, a dielectric layer and a plate node. The storage node is a silicon-containing conductive layer such as a polycrystalline silicon layer doped with an impurity. Also, the storage node has a three dimensional structure selected from the group consisting of a stack type, a hemispherical grained silicon layer type and a cylinder type.

The dielectric layer is formed of amorphous $Al_2O_3$, on the storage node. Here, the amorphous $Al_2O_3$ layer is formed by transmitting vapor reactive materials supplied by each source to the storage node in which reactions are sequentially processed. The thickness of the dielectric layer is 10~300 Å using an atomic layered deposition method, and the thickness of the amorphous $Al_2O_3$ dielectric layer is 40~70 Å. Also, a reaction preventing layer is formed of one selected from the group consisting of silicon oxide, silicon nitride and silicon oxynitride layer.

The plate node is a conductive layer formed of polycrystalline silicon doped with impurities. Alternatively, the plate node is a conductive layer formed of a refractory metal, a refractory metal silicide material or a refractory metal nitride material. For example, the refractory metal may be W, Mo, Ta, Ti or Cr. Also, the refractory metal silicide material is formed by silicidation of a refractory metal silicide material, such as Wsi$_2$, MoSi$_2$, TaSi$_2$ or TiSi$_2$, among others. The refractory metal nitride material is formed by nitrification of a refractory metal, such as TiN.

To achieve another objective, a storage node is formed. The storage node is a polycrystalline silicon layer doped with an impurity, and the storage node has a three-dimensional structure selected from the group consisting of a stack type, a hemispherical grained silicon layer type and a cylinder type.

Then, a reaction preventing layer is formed on the storage node. The reaction preventing layer is formed by annealing the storage node at 300~1200° C. In detail, a rapid thermal nitridation (RTN) process is performed using a $N_2$ source such as $NH_3$ gas as an ambient gas at approximately 900° C. Thus, the reaction preventing layer of the storage node may be formed of silicon oxide ($SiO_2$), silicon nitride (SiN) or silicon oxynitride (SiON).

Next, a dielectric layer is formed of an amorphous $Al_2O_3$ layer on the storage node. The amorphous $Al_2O_3$ layer is formed to a thickness of 10–300 Å by a method of supplying a reactive vapor phase material from each of several sources in sequence on a layer to be reacted with, i.e., the storage node, in which reaction, that is, deposition is performed in cycles, for instance, an atomic layer deposition (ALD) method. Preferably, the amorphous $Al_2O_3$ layer is formed to a thickness of 40–80 Å. The atomic layer deposition method is performed using one selected from the group consisting of $Al(CH_3)_3$ and $AlCl_3$ as an aluminum source, and the storage node is processed by hydrogen passivation treatment before performing the atomic layered deposition.

Then, a plate electrode is formed on the dielectric layer. The plate node is a conductive layer formed of polycrystalline silicon doped with impurities. Alternatively, the plate node is a conductive layer formed of a refractory metal, a refractory metal silicide material or a refractory metal nitride material. For example, the refractory metal may be W, Mo, Ta, Ti or Cr. Also, the refractory metal silicide material is formed by silicidation of a refractory metal silicide material, such as $WSi_2$, $MoSi_2$, $TaSi_2$ or $TiSi_2$, among others. The refractory metal nitride material is formed by nitrification of a refractory metal, such as TiN.

Also, a primary densification is performed on the amorphous $Al_2O_3$ dielectric layer, after the step of forming a plate node, by annealing the amorphous $Al_2O_3$ dielectric layer at a temperature below the temperature of crystallizing the amorphous $Al_2O_3$ layer, at 150–900° C. The annealing is performed using an ambient gas selected from the group consisting of $O_2$, NO and $N_2$ gas, or in a vacuum. Preferably, the primary densification is performed at 850° C.

Also, a secondary densification is additionally performed on the amorphous $Al_2O_3$ dielectric layer, before the step of forming a plate node, by annealing the amorphous $Al_2O_3$ dielectric layer at a temperature below the temperature of crystallizing the amorphous $Al_2O_3$ layer, at 150–900° C., using an ambient gas selected from the group consisting of $O_2$, NO and $N_2$ gas, or in a vacuum. Preferably, the annealing is performed using $O_2$ as an ambient gas at approximately 450° C.

Accordingly, the silicon-containing conductive layer is used as the storage node, and the capacitance can be increased.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
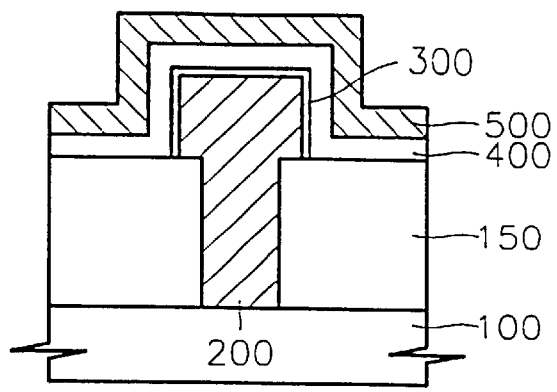
FIG. 1 is a sectional view of a capacitor according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

Referring to FIG. 1, a capacitor according to an embodiment of the present invention includes a storage node 200, a dielectric layer 400 and a plate node 500. The storage node 200 is electrically connected to an active region of a semiconductor substrate 100 through a contact hole formed in an interlevel insulating layer 150 covering the semiconductor substrate 100. A silicon-containing conductive layer such as a polycrystalline silicon layer doped with an impurity is used for the storage node 200.

An amorphous aluminum oxide $Al_2O_3$ layer is used for the dielectric layer 400 covering the storage node 200. The $Al_2O_3$ layer has little difference in dielectric constant between its crystalline phase, such as $\alpha$-$Al_2O_3$ and $\gamma$-$Al_2O_3$, and its amorphous phase, and has a dielectric constant of about 10. However, the amorphous $Al_2O_3$ layer is more easily oxidized than silicon oxide, has a low permeability of alkali ions and excellent properties. Also, the amorphous $Al_2O_3$ layer has a smooth morphology and high resistance to diffusion through a grain boundary, and thus diffusion of oxygen through it can be suppressed.

The amorphous $Al_2O_3$ layer is formed by sequentially supplying a reactive vapor phase material from each of several sources on a layer, i.e., the storage node. Particularly, a whole amorphous $Al_2O_3$ layer is obtained by repeating the formation of thin films. For example, an atomic layer deposition (ALD) method may be used.

By forming the amorphous $Al_2O_3$ layer using the ALD method, supplying in sequence the reactive vapor phase materials on a layer where reaction for forming the $Al_2O_3$ layer is performed, high conformity may be obtained and a step coverage may reach about 100%. Few impurities remain in the amorphous $Al_2O_3$ layer due to process properties of the ALD method. It has been known that an $Al_2O_3$ layer formed by sputtering has poor step coverage and if the $Al_2O_3$ layer is formed by CVD, it is difficult to remove remaining impurities and form a thin layer. Accordingly, in a preferred embodiment, the amorphous $Al_2O_3$ layer is formed by the ALD method, and thus has high step coverage and a more amorphous state. The amorphous $Al_2O_3$ layer is formed to a thickness of 10–300 Å, preferably 40–80 Å.

Also, a reaction preventing layer 300 of silicon oxide ($SiO_2$), silicon nitride (SiN) or silicon oxynitride (SiON) may be further formed between the storage node 200 and the dielectric layer 400. However, since the amorphous $Al_2O_3$ layer has low diffusivity of oxygen, the reaction preventing layer 300 can be omitted. The plate node 500 formed on the dielectric layer 400 is formed of a conductive layer formed of a polycrystalline silicon doped with impurities. Alternatively, the plate 500 is formed of a conductive layer formed of a refractory metal, a refractory metal silicide material or a refractory metal nitride material. For example, the refractory metal may be W, Mo, Ta, Ti or Cr. Also, the refractory metal silicide material is formed by silicidation of a refractory metal silicide material, such as $WSi_2$, $MoSi_2$, $TaSi_2$ or $TiSi_2$, among others. The refractory metal nitride material is formed by nitrification of a refractory metal, such as TiN.

Figure 2:
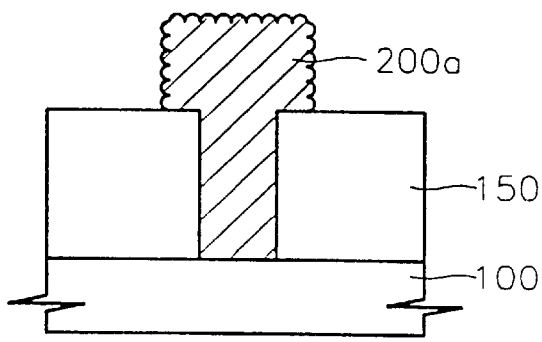
FIGS. 2 through 4 are sectional views showing structures of a storage node used for a capacitor according to embodiments of the present invention.
Figure 3:
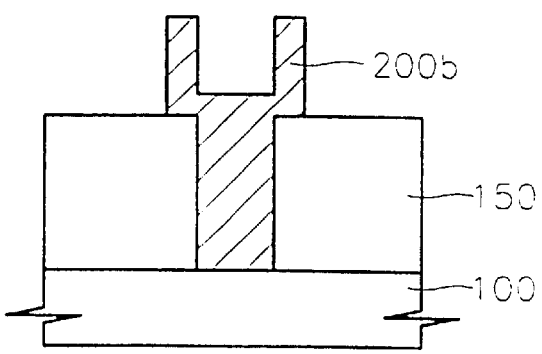
Figure 4:
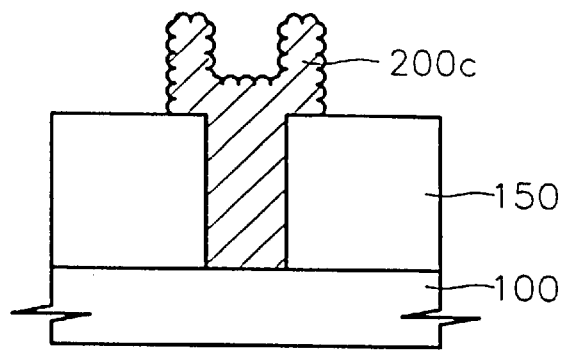

Meanwhile, the structures of a storage node of the capacitor may be formed in a variety of three-dimension structures. For instance, a stack type storage node 200 as shown in FIG. 1, can be adopted to the capacitor structure. Alternatively, a hemispherical grained silicon (HGS) layer may be formed on a surface of an electrode as shown in FIG. 2, so that the storage node 200a has the HGS structure, which increases the surface area due to its irregularity. Other structures may be used, such as a cylinder type storage electrode 200b as shown in FIG. 3, or a storage node 200c as shown in FIG. 4 in which the hemispherical grained silicon layer is formed on the surface of the cylinder type electrode to increase the surface area. Even though three-dimensional storage nodes such as 200, 200a, 200b and 200c are employed, a high conformity can be realized in the amorphous $Al_2O_3$ layer when the amorphous $Al_2O_3$ is formed by the ALD process. The high conformity avoids problems such as poor step coverage. Although preferred embodiment storage nodes 200, 200a, 200b and 200c are illustrated, other structures are possible as would be well known to one skilled in the art.

Figure 5:
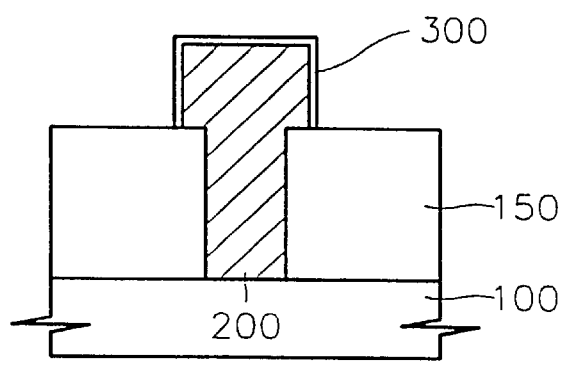
FIG. 5 is a sectional view for illustrating the step of forming the storage node on a semiconductor substrate.

Referring to FIG. 5, a storage node 200 is formed on a semiconductor substrate 100 where an interlevel insulating layer 150 is formed. The storage node 200 in the present embodiment may be shaped in a three-dimensional form such as a hemispherical grained silicon layer type or a cylinder type as described with respect to FIGS. 2 through 4, instead of the stack type. Also, the storage node 200 is formed of a conductive layer of a silicon group, such as a polycrystalline silicon layer doped with an impurity.

Then, the storage node 200 may be annealed by a rapid thermal process (RTP), to thereby additionally form a reaction preventing layer 300 covering the storage electrode 200. The annealing is performed at 300–1200° C., preferably 900° C., using an $NH_3$ gas as a nitrogen source for 60 sec, i.e., through rapid thermal nitridation (RTN). Through the annealing, the silicon of the storage node 200 reacts with nitrogen, to thereby form a SiN layer used as a reaction preventing layer 300. Also, a silicon oxide or silicon oxynitride layer may be used instead of the silicon nitride layer for the reaction preventing layer 300.

The reaction preventing layer 300 more completely prevents oxygen from being diffused into the storage node 200 during the annealing process, which is performed later, using an ambient gas of oxygen. That is, the equivalent thickness (ET) of an oxide layer can be prevented from increasing due to diffusion of oxygen. However the silicon nitride layer need not be formed by the RTP. This is because low oxygen diffusivity is maintained by the $Al_2O_3$ layer.

Figure 6:
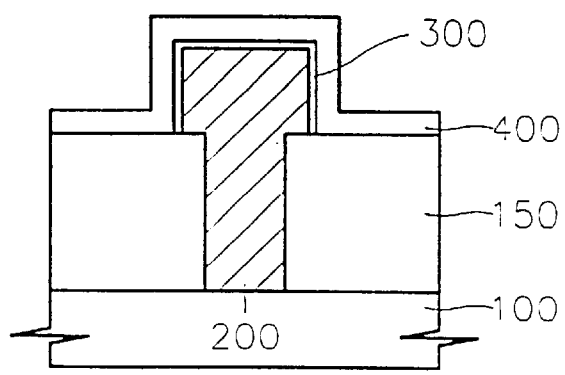
FIG. 6 is a sectional view for illustrating the step of forming a dielectric layer on the storage node of FIG. 5.

Referring to FIG. 6, a native oxide layer remaining on the storage node 200 is completely removed through hydrogen passivation treatment.

Then, the amorphous $Al_2O_3$ layer is formed on the storage node 200 by a method in which each reactive vapor phase material from several sources is supplied step by step onto the storage node 200. This may be achieved in various ways, particularly by the ALD method. By the ALD method, an aluminum (Al) layer is formed on the storage node 200 using an aluminum source, to a degree of atomic sized thickness. Then, the Al layer is oxidized with an oxidation agent to form an $Al_2O_3$ layer having an atomic-sized thickness, i.e., approximately 0.5–50 Å. Subsequently, the step of forming the $Al_2O_3$ layer having an atomic-sized thickness is performed in cycles, to thereby form an amorphous $Al_2O_3$ layer of 10–300 Å. Preferably, the amorphous $Al_2O_3$ layer is formed to a thickness of 40–80 Å.

Specifically, $Al(CH_3)_3$ or $AlCl_3$, preferably $Al(CH_3)_3$, is used as an aluminum source. Preferably, vaporized $H_2O$ is used as the oxidation agent. When the step of oxidizing the Al layer using the oxidation agent is performed, the temperature of the semiconductor substrate 100 is 150–400° C., preferably approximately 350° C. Also, the amorphous $Al_2O_3$ layer is grown to a thickness of approximately 2 Å by each cycle. The amorphous phase of the amorphous $Al_2O_3$ layer is realized according to characteristics of the ALD process. Also, the $Al_2O_3$ layer has high conformity according to the characteristics of the ALD. Thus, a step coverage of approximately 100% can be realized.

Then, a plate electrode 500 as shown in FIG. 1 is formed on the dielectric layer 400. The plate electrode 500 is formed of a conductive layer formed of a polycrystalline silicon doped with impurities. Alternatively, the plate electrode 500 is formed of a conductive layer formed of a refractory metal, a refractory metal silicide material or a refractory metal nitride material. For example, the refractory metal may by W, Mo, Ta, Ti or Cr. Also, the refractory metal silicide material is formed by silicidation of a refractory metal silicide material, such as $WSi_2$, $MoSi_2$, $TaSi_2$ or $TiSi_2$, among others. The refractory metal nitride material is formed by nitrification of a refractory metal, such as TiN.

The grown amorphous $Al_2O_3$ layer has a refractivity of approximately 1.64λ, where λ=633.0 nm. The amorphous $Al_2O_3$ layer can be densified through a subsequent annealing process. The degree of densification can be evaluated by measuring the refractivity and the thickness of the layer. That is, the amorphous $Al_2O_3$ layer is grown, and then annealed under an $O_2$ ambient gas, after that the refractivity of the annealed $Al_2O_3$ layer is measured to estimate the degree of the densification.

TABLE 1

Characteristics before and after growing $Al_2O_3$ layer

|  | Refractivity (λ = 633.0 nm) |
| --- | --- |
| After growing | 1.64 |
| After annealing (about 800° C., $O_2$, for 30 min) | 1.692 |

As shown in Table 1, the refractivity of the amorphous $Al_2O_3$ layer is increased, through $O_2$ annealing, which leads to densification of the amorphous $Al_2O_3$ layer. Thus, the dielectric constant of the amorphous $Al_2O_3$ layer is increased, so that the equivalent thickness (ET) of an oxide is minimized.

To show how the amorphous $Al_2O_3$ layer suppresses $O_2$ diffusion, thickness of the $SiO_2$ layer formed on a bare wafer was measured as a function of the thickness of a layer of $Al_2O_3$ formed on the wafer. That is, an amorphous $Al_2O_3$ layer having various thicknesses was formed on a bare wafer. The wafer was treated with standard cleaners I and HF, and then the amorphous $Al_2O_3$ layer was annealed under an $O_2$ ambient gas at approximately 800° C. Then, the thickness of the formed $SiO_2$ layer was measured using a spectroscopic elipsometer. The results are shown in Table 2.

As shown in Table 2, if the amorphous $Al_2O_3$ layer is not formed, the $SiO_2$ layer is grown to approximately 66.6 Å. If an amorphous $Al_2O_3$ layer is employed, the thickness of the $SiO_2$ layer is abruptly reduced. If the amorphous $Al_2O_3$ layer of approximately 100 Å is employed, the $SiO_2$ layer is reduced to a thickness of approximately 2 Å. As described above, the amorphous $Al_2O_3$ layer of the present embodiment suppresses $O_2$ diffusion, so that excellent capacitor properties can be realized even without the reaction preventing layer 300 being formed through the RTP. However, the reaction preventing layer 300 may be employed to completely prevent $O_2$ diffusion during a subsequent process of annealing.

TABLE 2

Thickness of $SiO_2$ layer -vs- thickness of $Al_2O_3$ layer

| Thickness of $Al_2O_3$ after annealing (Å) | Thickness of $SiO_2$ (Å) |
|---|---|
| 0 | 66.576 |
| 28.860 | 17.032 |
| 33.369 | 18.959 |
| 48.484 | 11.222 |
| 82.283 | 3.406 |
| 98.711 | 2.002 |
| 258.749 | 1.542 |

In order to increase the dielectric constant, a primary densification is performed on the amorphous $Al_2O_3$ layer, through annealing. This annealing for densification can be performed at any time after forming the amorphous $Al_2O_3$ layer, preferably after forming the plate node 500. The annealing is performed at approximately 150–900° C., preferably 850° C., which is lower than the crystallization temperature of the amorphous $Al_2O_3$ layer, using $O_2$ gas, NO gas or $N_2$ gas as an ambient gas, or in a vacuum. Preferably, the annealing is performed in the ambient gas of $N_2$ for approximately 30 min.

The amorphous $Al_2O_3$ layer gives an ET value which approximates, for instance, a theoretical ET value of about 26 Å, when the thickness of the amorphous $Al_2O_3$ layer is about 60 Å, and the dielectric constant of the $Al_2O_3$ is assumed to be 9. However, the annealing can be further performed to realize a value even more closely approximating the theoretical ET value. That is, a secondary densification is performed through annealing immediately after forming the amorphous $Al_2O_3$ layer, and this is a pretreatment for the primary densification.

Here, the secondary densification is performed at 150–900° C., preferably 450° C., which is lower than the crystallization temperature of the amorphous $Al_2O_3$ layer, using $O_2$ gas, NO gas or $N_2$ gas as an ambient gas, or in a vacuum. Preferably, the secondary densification is performed by annealing in the ambient gas of $O_2$ for about 30 min.

Table 3 shows various electric characteristics measured under various conditions in order to illustrate the effect of the secondary densification. That is, the storage node 200 is formed from a polycrystalline silicon layer on a semiconductor substrate 100, the amorphous $Al_2O_3$ layer is formed, and electrical properties of the capacitor are measured. Table 3 contains the results of ten measurements, showing the effects when the RTN process of $NH_3$ is performed at 900° C. for 60 sec or not performed, the amorphous $Al_2O_3$ layer is formed to 60 Å or 300 Å, and the secondary densification is performed using $O_2$ at approximately 450° C. for 30 min, at approximately 800° C. for 30 min, or not performed.

As shown in Table 3, the $Al_2O_3$ layer of about 300 Å has a leakage current density of 20 $nA/cm^2$ or less, regardless of other conditions.

However, the leakage current of the $Al_2O_3$ layer of about 60 Å is changed by other conditions. For example, in the case No. 7 of the $Al_2O_3$ layer of 60 Å without RTN, and with the secondary densification at 800° C., the ET is approximately 57 Å, which is the greatest for all cases where the thickness of the $Al_2O_3$ layer is 60 Å. Also, for example, in case No. 1 with the RTN process, the ET is approximately 47 Å, which is more than the theoretical ET value 30 Å (i.e., an RTN layer of 4 Å+an $Al_2O_3$ layer of 26 Å). This means that the equivalent oxide layer has grown.

Moreover, in case No. 3 when the $Al_2O_3$ layer of 60 Å thick, the temperature of the secondary densification is 450° C., and the RTN is performed, the ET is 40 Å, and in the case No. 6 when the $Al_2O_3$ layer is 60 Å thick, the secondary densification temperature is 450° C. and the RTN process is not performed, the ET is 37 Å. However, in the case No. 6, the leakage current density of approximately 700 $nA/cm^2$ is higher in comparison to approximately 45 $nA/cm^2$ in the case No. 3.

From these results, we note that the electric characteristics of a capacitor are excellent in the case of performing secondary densification at 450° C. as, for example, in case No. 3. Also, if the reaction preventing layer 300 such as a $SiN_2$ layer, a $SiO_2$ layer or a SiON layer is formed through annealing such as RTN, between the storage node 200 and the dielectric layer 400, the electrical characteristics of the capacitor are enhanced.

TABLE 3

Electric characteristics of capacitor as a function of secondary densification

| No. | RTN | Thickness of $Al_2O_3$ layer (Å) | Temperature of $O_2$ secondary densification | Capacitance (pF) $C_{min}$ | $C_{max}$ | tan δ | leakage current density ($nA/cm^2$) | Thickness of equivalent oxide layer (ET)(Å) | $C_{min}/C_{max}$ (%) |
|---|---|---|---|---|---|---|---|---|---|
| 1 | yes | 60 | 800 | 615 | 661 | 0.012 | 25.8 | 47 | 93 |
| 2 | | 300 | 800 | 235 | 247 | 0.031 | ≦20 | 125 | 95 |
| 3 | | 60 | 450 | 718 | 772 | 0.009 | 45.77 | 40 | 93 |
| 4 | | 300 | 450 | 259 | 263 | 0.042 | ≦20 | 117 | 98 |
| 5 | | 300 | — | 218 | 229 | 0.045 | ≦20 | 135 | 95 |
| 6 | no | 60 | 450 | 766 | 832 | 0.06 | 704.38 | 37 | 92 |
| 7 | | 60 | 800 | 535 | 546 | 0.014 | 37.32 | 57 | 98 |
| 8 | | 300 | 450 | 248 | 252 | 0.019 | ≦20 | 117 | 98 |

TABLE 3-continued

Electric characteristics of capacitor as a function of secondary densification

| No. | RTN | Thickness of $Al_2O_3$ layer (Å) | Temperature of $O_2$ secondary densification | Capacitance (pF) | | | leakage current density (nA/cm$^2$) | Thickness of equivalent oxide layer (ET)(Å) | $C_{min}/C_{max}$ (%) |
|---|---|---|---|---|---|---|---|---|---|
| | | | | $C_{min}$ | $C_{max}$ | tan δ | | | |
| 9 | | 300 | — | 210 | 219 | 0.052 | ≦20 | 141 | 96 |
| 10 | | 300 | 800 | 222 | 223 | 0.046 | ≦20 | 138 | 99 |

As described above, when the amorphous $Al_2O_3$ layer is employed as the dielectric layer 400 and the secondary densification is performed, the electrical characteristics of the capacitor are enhanced. However, the ET values realized under the above conditions do not reach the theoretical value of 30 Å. Thus, the effect of performing the primary densification after forming the plate node 500 will be described. That is, the plate node 500 is formed under conditions as shown in Table 3 and then annealed at approximately 850° C. for 30 min using an ambient gas of $N_2$, for a primary densification, and then the electrical characteristics of the capacitor are measured for the ten different process conditions of Table 3.

Table 4 shows the results of these measurements. In Table 4, 'C', 'B', 'T', 'L' and 'R' indicate center, bottom, top, left and right portions of a wafer, respectively. The primary densification can reduce the ET values for all cases as shown in Table 4. In the case that the $Al_2O_3$ layer is annealed at approximately 450° C. during the secondary densification process and RTN is performed (No. 3-C), the ET value is 35 Å. In the case where the other conditions are the same as that of No. 3-C, but the RTN process is not performed (No. 6-C), the ET value is 31 Å. Both results approximate to the theoretical value of 30 Å. Thus, these results show that the secondary densification of the amorphous $Al_2O_3$ layer further increases capacitance.

Figure 7:
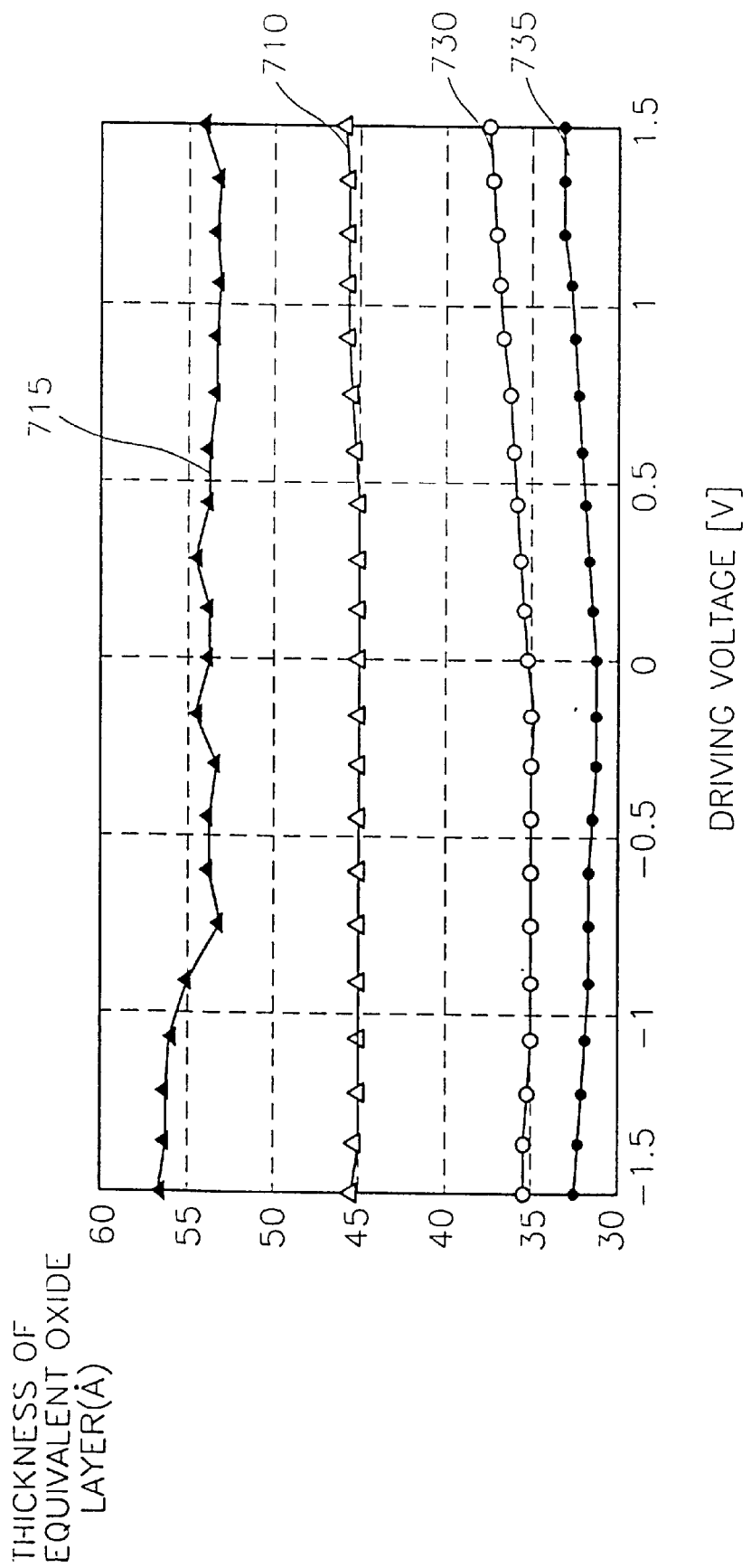
FIG. 7 is a graph showing the relationship between the thickness of an equivalent oxide layer of an amorphous $Al_2O_3$ and applied driving voltage.

FIG. 7 shows the ET at the amorphous $Al_2O_3$ layer of 60 Å in Table 4, as a function of an applied voltage. That is, reference numerals 710, 715, 730 and 735 indicate ET values for the cases No. 1, No. 7, No. 3 and No. 6 respectively of Table 4, as a function of applied voltage. As shown in FIG. 7, if the secondary densification using $O_2$ is performed at 450° C. for 30 min and the primary densification of $N_2$ is performed at 850° C. for 30 min (730 and 735), i.e., in the cases No. 3 and No. 6 of Table 4, the measured ET values approximate the theoretical ET value of 30 Å.

Figure 8:
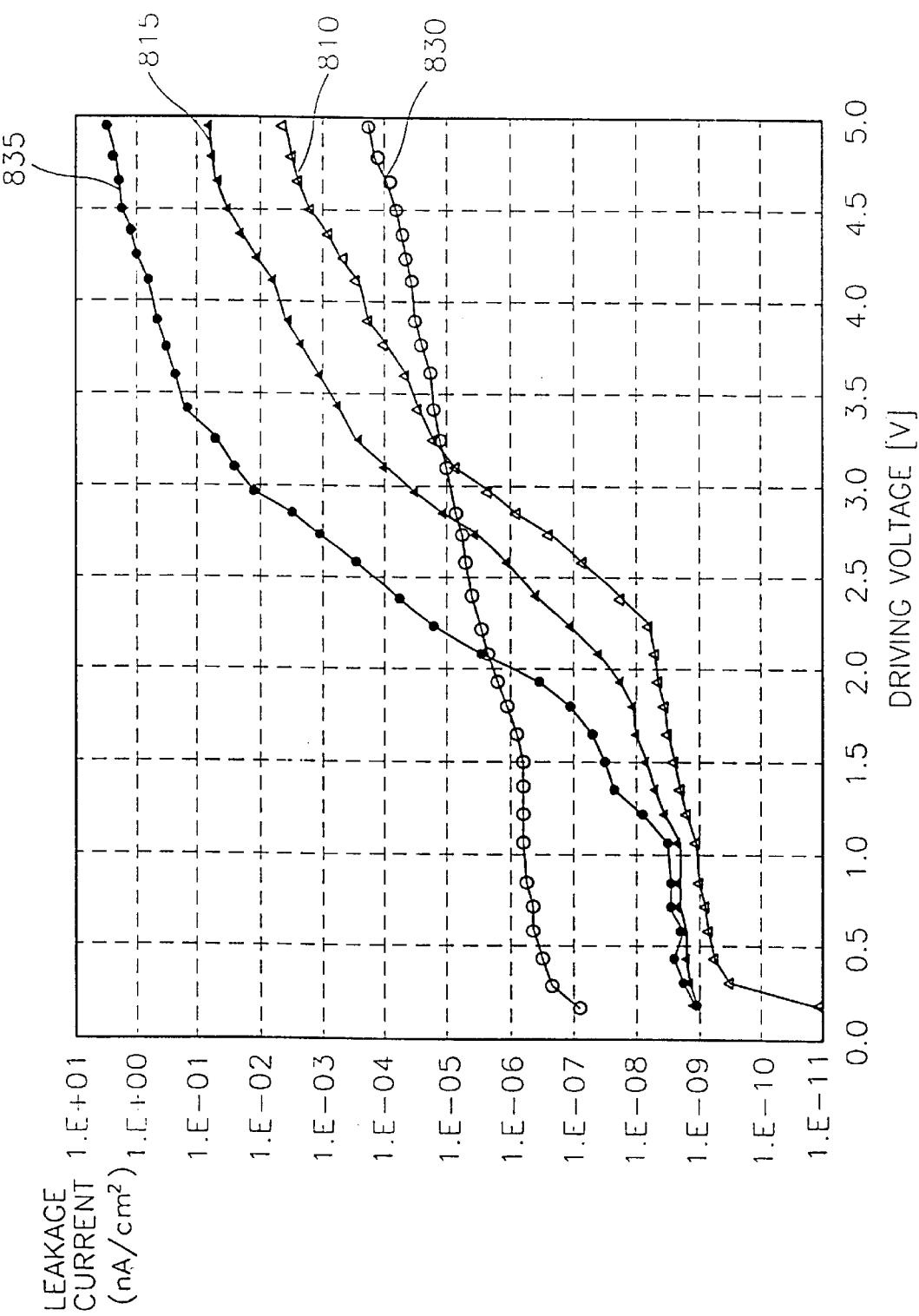
FIG. 8 is a graph showing leakage current density with respect to a drive voltage applied to a capacitor having an amorphous $Al_2O_3$ layer of 60 Å.

Referring to FIG. 8, reference numerals 810, 815, 830 and 835 indicate leakage current densities for the cases No. 7, No. 1, No. 6 and No. 3 respectively of Table 4, as a function of applied voltage. As shown in FIG. 8, among the cases 730 and 735 approximating the theoretical ET value as illustrated in FIG. 7, i.e., in the cases No. 3 and No. 4 of Table 4, case No. 3 exhibits a lower leakage current density at driving voltages of 2 V or less. Thus, if the secondary densification with $O_2$ is performed at approximately 450° C. for 30 min according to the conditions of case No. 3 of Table 4, i.e., after the RTN process, and the primary densification with $N_2$ is performed at 850° C. for 30 min, then the electrical characteristics of the capacitor are excellent.

The effect of the secondary densification will be described as follows. The temperature for the secondary densification

TABLE 4

Electrical characteristics of capacitor depending on primary densification

| No. | RTN | Position of semiconductor substrate | Thickness of $Al_2O_3$ layer (Å) | Temperature of $O_2$ secondary densification (° C.) | Capacitance (pF) | | | Leakage current density (nA/cm$^2$) | Thickness of Equivalent oxide layer (ET; Å) | $C_{min}/C_{max}$ (%; ± 2V) |
|---|---|---|---|---|---|---|---|---|---|---|
| | | | | | $C_{min}$ | $C_{max}$ | tan δ | | | |
| 1 | yes | C | 60 | 800 | 680 | 690 | 0.012 | 7.96 | 44.8 | 98.6 |
| 2 | | C | 300 | 800 | 250 | 270 | 0.019 | 15.2 | 118.3 | 92.6 |
| 3 | | T | 60 | 450 | 830 | 874 | 0.014 | 68.4 | 35.07 | 95 |
| | | C | | | 840 | 890 | 0.028 | 28.6 | 34.89 | 94.4 |
| | | B | | | 830 | 876 | 0.032 | 25.6 | 35.31 | 94.7 |
| | | L | | | 825 | 859 | 0.035 | 53.6 | 36.02 | 96 |
| | | R | | | 840 | 882 | 0.014 | 65.4 | 35.07 | 95.2 |
| 4 | | C | 300 | 450 | 270 | 290 | 0.017 | 16.5 | 110 | 93.1 |
| 5 | | C | 300 | — | 260 | 270 | 0.017 | 13.1 | 116.1 | 96.3 |
| 6 | no | T | 60 | 450 | 932 | 987 | 0.019 | — | 31.34 | 94.4 |
| | | C | | | 930 | 990 | 0.017 | 677 | 31.30 | 94.4 |
| | | B | | | 905 | 946 | 0.011 | — | 32.71 | 95.7 |
| | | L | | | 925 | 971 | 0.014 | — | 31.86 | 95.3 |
| | | R | | | 910 | 964 | 0.016 | — | 32.09 | 94.4 |
| 7 | | C | 60 | 800 | 540 | 580 | 0.018 | 2.29 | 53.4 | 93.1 |
| 8 | | C | 300 | 450 | 310 | 313 | 0.018 | 13.3 | 98.8 | 99 |
| 9 | | C | 300 | — | 250 | 260 | 0.02 | 4.89 | 119.8 | 96.2 |
| 10 | | C | 60 | 800 | 230 | 240 | 0.02 | 11.2 | 133.5 | 95.8 | is set to 450° C., which can produce excellent electrical characteristics of a capacitor as described above. Also, whether the ambient gas for the secondary densification is a gas other than $O_2$, (i.e., $N_2$), or whether the secondary densification is performed, are set as variables. The time for the secondary densification and the thickness of the amorphous $Al_2O_3$ layer are also set as variables. The ET value and the leakage current density are measured as these variables are changed. The conditions are shown in Table 5.

TABLE 5

| Reference numeral | Thickness of $Al_2O_3$ layer (Å) | Ambient gas | Time for secondary densification (min) |
|---|---|---|---|
| 910 | 40 | $N_2$ | 10 |
| 920 | 50 | $O_2$ | 10 |
| 930 | 50 | $O_2$ | 30 |
| 940 | 50 | $N_2$ | 10 |
| 950 | 60 | $O_2$ | 10 |
| 960 | 60 | $O_2$ | 30 |
| 970 | 60 | $N_2$ | 10 |
| 980 | 60 | none | 0 |

Figure 9:
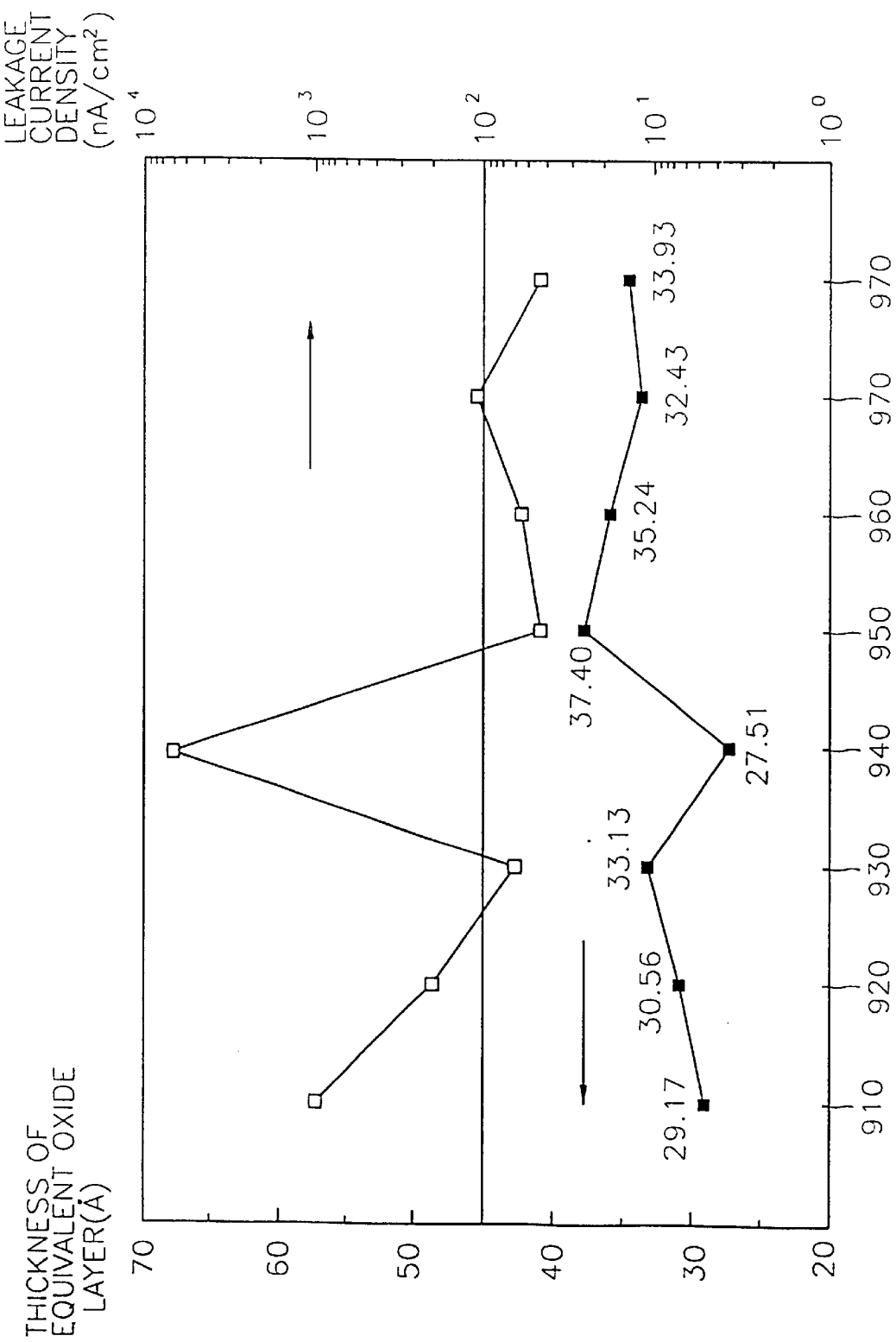
FIG. 9 is a graph showing electrical characteristics of a capacitor according to various condition variables during annealing at approximately 450° C. after forming an amorphous $Al_2O_3$ layer.

FIG. 9 shows the ET and leakage currents for the various conditions shown in Table 5. Reference numeral 940 represents the lowest ET and the highest leakage current density. However, reference numerals 950, 960, 970 and 980, for an amorphous $Al_2O_3$ layer of approximately 60 Å, represent ETs and leakage current densities which are similar to each other. Also, as the amorphous $Al_2O_3$ layer is closer to 40 Å (910), the ET values are similar and the leakage current density is increased. Thus, in the amorphous $Al_2O_3$ layer of approximately 60 Å, the properties of capacitor change little without regard to whether the secondary densification is performed or not, to what ambient gas is used, or to changes in secondary densification time. This means that the secondary densification is not always a required step. In other words, the secondary densification is for compensating for the primary densification. Even through the plate node 500 is formed on the dielectric layer 400 without the secondary densification, a capacitor having excellent characteristics can be realized. That is, when the amorphous $Al_2O_3$ layer and the plate node 500 are formed after an RTN process of the storage node 200, and then the primary densification using $N_2$ at approximately 850° C. for 30 min is performed, the electrical characteristics of the capacitor are excellent.

Accordingly, the amorphous $Al_2O_3$ dielectric layer is formed on the storage node using a method for supplying each reactive vapor phase material from several sources on a layer i.e., the storage node, where a reaction, e.g., deposition, is performed, in cycles, e.g., ALD method. During forming the amorphous $Al_2O_3$ layer, the amorphous phase can be realized using the method for supplying reactive vapor phase materials on a layer where a reaction is performed in cycles. Also, by such a method, no impurity remains in the amorphous $Al_2O_3$ layer. The amorphous $Al_2O_3$ layer has a low $O_2$ diffusivity. Thus, when a conductive layer of the silicon group is employed as the storage node, it is possible to prevent the equivalent oxide layer from growing excessively. That is, a capacitor of the SIS structure can be realized, like in the capacitor of the ONO structure, to thereby overcome difficulties due to a change of the structure of the capacitor to the MIS structure or MIM structure.

Also, an amorphous $Al_2O_3$ layer having a smooth morphology and high conformity can realize a step coverage of approximately 100%. Thus, the storage node can be formed as a cylinder type, an HSG type or a stack type, to thereby increase capacitance. The amorphous $Al_2O_3$ layer has a dielectric constant equivalent to that of an aluminum layer of a crystalline phase, to thereby realize high capacitance.

After forming the plate node on the amorphous $Al_2O_3$ layer, the amorphous $Al_2O_3$ layer can be densified by annealing at a temperature below the temperature of crystallizing the $Al_2O_3$, e.g., at approximately 850° C. The densification reduces the thickness of the amorphous $Al_2O_3$ layer and increases the refractivity. That is, the dielectric constant of the amorphous $Al_2O_3$ layer is increased. Also, the thickness of the equivalent oxide layer is reduced, so that a thickness approximating the theoretical ET value, e.g., approximately 30 Å, can be realized, to thereby increase capacitance.

A reaction preventing layer can be formed between the amorphous $Al_2O_3$ layer and the storage node, in order to reduce the thickness of the equivalent oxide layer and help the capacitor operate stably. A secondary densification may be additionally performed to compensate for the step of densifying the amorphous $Al_2O_3$ layer, so that the thickness of the equivalent oxide layer approximates the theoretical ET value, to thereby increase capacitance.

Preferred embodiments of the invention have been disclosed in the drawings and specification, and although specific terms are employed, they are used in a descriptive sense only and not for purposes of limitation. The scope of the invention is set forth in the following claims.

What is claimed is:

1. A method for forming a capacitor of a semiconductor device, comprising:
   (a) forming a storage node;
   (b) forming a dielectric layer of amorphous $Al_2O_3$ on the storage node, wherein the amorphous $Al_2O_3$ is formed by ALD (Atomic Layer Deposition) using a tri-methyl aluminum $(Al(CH_3)_3)$ source and an oxidative source; and
   (c) forming a plate node on the dielectric layer.

2. The method of claim 1, wherein the storage node is a polycrystalline silicon layer doped with an impurity.

3. The method of claim 1, wherein the storage node has a three-dimensional structure selected from the group consisting of a stack type, a hemispherical grained silicon layer type and a cylinder type.

4. The method of claim 1, further comprising forming a reaction preventing layer on the storage node, before of forming the dielectric layer.

5. The method of claim 4, wherein the reaction preventing layer is formed of one selected from the group consisting of silicon oxide, silicon nitride and silicon oxynitride layer.

6. The method of claim 4, wherein the reaction preventing layer is formed by annealing the storage node at 300–1200° C.

7. The method of claim 6, wherein the annealing is performed by a rapid thermal process in an ambient $N_2$ source gas.

8. The method of claim 1, wherein the amorphous $Al_2O_3$ dielectric layer is formed to have a thickness of 10–300 Å.

9. The method of claim 8, wherein the amorphous $Al_2O_3$ dielectric layer is formed to have a thickness of 40–80 Å.

10. The method of claim 1, wherein the storage node is processed by hydrogen passivation treatment before performing the atomic layered deposition.

11. The method of claim 1, wherein a primary densification is performed on the amorphous $Al_2O_3$ dielectric layer, after forming the plate node.

12. The method of claim 11, wherein the primary densification is performed by annealing the amorphous $Al_2O_3$ dielectric layer at a temperature below the temperature of crystallizing the amorphous $Al_2O_3$ layer.

13. The method of claim 12, wherein the primary densification is performed at 150–900° C.

14. The method of claim 13, wherein the primary densification is performed at 850° C.

15. The method of claim 12, wherein the annealing is performed using an ambient gas selected from the group consisting of $O_2$, NO and $N_2$ gas, or in a vacuum.

16. The method of claim 11, wherein a secondary densification is additionally performed on the amorphous $Al_2O_3$ dielectric layer, before forming a plate node.

17. The method of claim 16, wherein the secondary densification is performed by annealing the amorphous $Al_2O_3$ dielectric layer at a temperature below the temperature of crystallizing the amorphous $Al_2O_3$ layer.

18. The method of claim 17, wherein the secondary densification is performed at 150–900° C.

19. The method of claim 17, wherein the secondary densification is performed using an ambient gas selected from the group consisting of $O_2$, NO and $N_2$ gas, or in a vacuum.

20. The method of claim 1, wherein the plate node is a conductive layer consisting of one of a refractory metal, a refractory metal silicide material, a refractory metal nitride material and a polycrystalline silicon doped with impurities, in which the refractory metal is one selected from the group consisting of W, Mo, Ta, Ti and Cr.

* * * * *